US011416050B2

(12) United States Patent
Troy et al.

(10) Patent No.: US 11,416,050 B2
(45) Date of Patent: Aug. 16, 2022

(54) COMPONENT COMMUNICATIONS IN SYSTEM-IN-PACKAGE SYSTEMS

(71) Applicant: Octavo Systems LLC, Austin, TX (US)

(72) Inventors: Kevin Michael Troy, College Station, TX (US); Peter Robert Linder, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 1438 days.

(21) Appl. No.: 15/589,823

(22) Filed: May 8, 2017

(65) Prior Publication Data

US 2018/0321313 A1 Nov. 8, 2018

(51) Int. Cl.
*G06F 1/26* (2006.01)
*G06F 1/22* (2006.01)
*G06F 1/28* (2006.01)
*G01R 31/28* (2006.01)

(52) U.S. Cl.
CPC .................. *G06F 1/26* (2013.01); *G06F 1/22* (2013.01); *G06F 1/28* (2013.01); *G01N 2201/12* (2013.01); *G01R 31/2879* (2013.01)

(58) Field of Classification Search
CPC .............................................. G01R 31/318508
See application file for complete search history.

(56) References Cited

U.S. PATENT DOCUMENTS

| 4,667,403 A | 5/1987 | Edinger |
| 5,396,403 A | 3/1995 | Patel |
| 5,683,788 A | 11/1997 | Dugan |
| 5,696,029 A | 12/1997 | Alvarez et al. |
| 5,710,693 A * | 1/1998 | Tsukada .................... G06F 1/16 361/679.32 |
| 6,133,626 A | 10/2000 | Hawke |
| 6,268,238 B1 | 7/2001 | Davidson |
| 7,060,535 B1 | 6/2006 | Sirinorakul et al. |
| 8,065,576 B2 | 11/2011 | Miner et al. |
| 9,490,188 B2 | 11/2016 | Arvelo et al. |
| 9,984,762 B1 * | 5/2018 | Seshasayee .......... G11C 29/785 |
| 10,204,890 B2 * | 2/2019 | Murtuza ................. H01L 24/48 |
| 10,470,294 B2 * | 11/2019 | Welsh .................. H05K 1/0231 |
| 10,714,430 B2 * | 7/2020 | Murtuza ................. H01L 24/17 |

(Continued)

FOREIGN PATENT DOCUMENTS

| EP | 1926138 A1 | 5/2008 |
| WO | 9852226 A1 | 11/1998 |
| WO | 2016025693 A1 | 2/2016 |

OTHER PUBLICATIONS

Office Action issued for U.S. Appl. No. 15/968,184 dated Nov. 15, 2018, 25 pages.

(Continued)

*Primary Examiner* — Manuel A Rivera Vargas
*Assistant Examiner* — Yaritza H Perez Bermudez
(74) *Attorney, Agent, or Firm* — Rothwell, Figg, Ernst & Manbeck, P.C.

(57) ABSTRACT

A power management device and microprocessor within a System-in-Package (SiP) are provided with communication signals externally available as outputs from the SiP so that they can be configured by an external device. Methods for the configuration of SiPs and Power Management Integrated Circuits (PMICs) packaged within a SiP are also provided.

23 Claims, 10 Drawing Sheets

(56) References Cited

U.S. PATENT DOCUMENTS

| | | | |
|---|---|---|---|
| 10,922,251 B2* | 2/2021 | Lee | G06F 9/445 |
| 2002/0017708 A1 | 2/2002 | Takagi et al. | |
| 2002/0052054 A1 | 5/2002 | Akram | |
| 2002/0170901 A1 | 11/2002 | Lau | |
| 2003/0010477 A1* | 1/2003 | Khrustalev | F28D 15/0266 |
| | | | 165/104.33 |
| 2003/0110427 A1 | 6/2003 | Rajsuman et al. | |
| 2004/0229400 A1 | 11/2004 | Chua | |
| 2007/0013402 A1* | 1/2007 | Ong | G01R 31/31722 |
| | | | 324/762.01 |
| 2008/0029868 A1 | 2/2008 | Lee | |
| 2008/0288908 A1* | 11/2008 | Hart | G06F 30/394 |
| | | | 716/137 |
| 2008/0290486 A1 | 11/2008 | Chen et al. | |
| 2009/0278245 A1 | 11/2009 | Bonifield et al. | |
| 2010/0052135 A1 | 3/2010 | Shim et al. | |
| 2010/0134133 A1 | 6/2010 | Pagani | |
| 2011/0022826 A1* | 1/2011 | More | G06F 1/26 |
| | | | 713/1 |
| 2011/0233753 A1 | 9/2011 | Camacho et al. | |
| 2012/0241984 A9 | 9/2012 | Pendse | |
| 2013/0214386 A1 | 8/2013 | Xie | |
| 2014/0035102 A1* | 2/2014 | Korec | H01L 29/7394 |
| | | | 257/566 |
| 2014/0035548 A1* | 2/2014 | Oaklander | H02M 7/537 |
| | | | 323/283 |
| 2014/0097818 A1* | 4/2014 | Wiktor | H02M 3/156 |
| | | | 323/283 |
| 2014/0284701 A1* | 9/2014 | Korec | H01L 29/872 |
| | | | 257/328 |
| 2015/0028940 A1* | 1/2015 | Tsao | H01L 23/5286 |
| | | | 327/538 |
| 2015/0130040 A1 | 5/2015 | Defretin | |
| 2017/0023999 A1* | 1/2017 | Reynov | G06F 11/325 |
| 2017/0115717 A1* | 4/2017 | Shankar | H03K 19/017509 |
| 2017/0336816 A1* | 11/2017 | Okajima | G05F 1/10 |
| 2018/0247905 A1* | 8/2018 | Yu | H01L 24/20 |
| 2018/0254079 A1* | 9/2018 | Cox | G06F 11/1048 |
| 2018/0321313 A1* | 11/2018 | Troy | G06F 1/28 |
| 2019/0355678 A1* | 11/2019 | Lin | H01L 21/32136 |
| 2020/0019312 A1* | 1/2020 | Kinsley | G06F 3/0688 |
| 2020/0201762 A1* | 6/2020 | Bang | G06F 12/0804 |

OTHER PUBLICATIONS

International Search Report and Written Opinion issued in Application No. PCT/US2015/045022, dated Nov. 4, 2015, 14 pages.
International Search Report and Written Opinion issued in Application No. PCT/US16/50157, dated Jan. 17, 2017, 24 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C. R. Schlottmann, "Analog Signal Processing on a Reconfigurable Platform", Master's Thesis, School of Electrical and Computer Engineering, Georgia Institute of Technology, Aug. 2009, 72 pages.
J. McEleney, et al., "Multisite Test Strategy For SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems in Nanoscale Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.
S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for The University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
Hashimoto et al., "A System-in-Package (SiP) With Mounted Input Capacitors for Reduced Parasitic Inductances in a Voltage Regulator," 2010, IEEE, 25(3), pp. 731-740.
Office Action issued for U.S. Appl. No. 15/503,932 dated Jan. 5, 2018, 20 pages.
Final Office Action issued for U.S. Appl. No. 15/503,932 dated Aug. 2, 2018, 9 pages.

* cited by examiner

COMPONENT COMMUNICATIONS IN SYSTEM-IN-PACKAGE SYSTEMS

TECHNICAL FIELD

Aspects of the present disclosure relate to communications with and/or between components of a packaged system.

BACKGROUND

System-In-Package ("SiP") systems may contain multiple devices, including both active and passive devices. These systems can include, for example, microprocessors (uPs), memories, analog interfaces, sensors, power drivers and passive devices. These individual devices typically need to receive power, and thus, the systems may use power management devices. Traditionally, management devices have been designed assuming they are independent devices populated on a PCB, and therefore, can easily be debugged, for instance, by disconnecting the various signal lines that are used for the communications and manipulating them as needed for modification or testing. However, once component devices are integrated into a packaged system, these signals may no longer be available to the outside, as all connections are now inside the package. Because the signals from these devices are not available outside of the system, the devices cannot be debugged, and the various devices cannot be independently managed, modified, and/or tested. For example, it may not be possible for a power management device may to be programmed to adjust its output voltages once it is installed in a packaged system.

Accordingly, there remains a need for effective ways to manage power and connections for individual components and/or a system after the system has been packaged.

SUMMARY

According to some embodiments, a SiP device is described in which selected signals for components and devices in the SiP are connected inside the SiP for normal SiP operations, and are also provided externally from the SiP for one or more of programming, testing, and debugging.

According to some embodiments, a SiP device is provided which has a substrate, a power management device, a uP, which can include a microcomputer/microcontroller (uC), and one or more additional components, where the components and uP are arranged such that the SiP will perform one or more preselected functions. The SiP device may also include a plurality of external connectors and a package that encapsulates the power management device, uP, and the additional components, but leaves the external connectors exposed. The external connectors may be, for instance, pin connectors or a ball grid array. According to certain aspects, a first plurality of the external connectors are for providing and/or receiving signals corresponding to the one more preselected functions during normal operation of the SiP device, while a second plurality of the external connectors are for providing and/or receiving communications signaling for one or more of the power management device and uP. Additionally, a third plurality of the external connectors may be for providing and/or receiving at least one of an input voltage and an output voltage of the power management device. In certain aspects, the external connectors are arranged such that power management device can be configured by an external device, such as a test controller.

To power all of the devices of a system, a class of components referred to as Power Management Integrated Circuits (PMICs), along with other power management devices such as Low Drop Out power supplies (LDOs), may be implemented. In certain aspects, a PMIC device may be designed to work with specific uPs to properly power up devices, protect against over voltage or over current, and/or do specific handshakes with a uP to make sure the system is operating correctly.

According to some embodiments, a PMIC is provided that includes at least one programmable power generating subsystem and a control logic subsystem. The power generating subsystem may be configured, for instance, to output a plurality of signals, where a first of the plurality of signals has a first value for powering one or more components of a device, and a second of the plurality of signals has a second value. In some embodiments, the first value is an operational value and the second value is a monitoring value indicative of the first value. The control logic subsystem can be used for setting the first value. For example, the control logic subsystem can be configured to modify the first value based on the second value. In some embodiments, the first and second value are the same. The second value may also be a predefined multiple or fraction of the first value. The control logic subsystem can be externally controllable via one or more inputs of the PMIC. In further embodiments, a PMIC may be provided with a plurality of externally controllable switches. In some instances, the switches may be arranged to selectively prevent output of the first signals, such as operational power signals, and enable output of the second of signals, which can be sense/monitoring signals.

According to some embodiments, one or more signals, including power and/or control signaling, from both a PMIC and the uP devices in a packaged system, such as a SiP, are output to external pins or ball grid connectors exposed from the packaging of the system. In some embodiments, the SiP may use a wireless communications subsystem in addition to, or in place of, the exposed external connectors for communicating the internal signals to outside sources. According to certain aspects, a SiP with such features can not only allow a system designer to debug the power management portion of the SiP, but also allow the system to monitor and manage how the PMIC and uP behave and interact in the SiP. In some instances, a system designer may make additional connections external to the SiP to enable testing and/or external power delivery.

In some embodiments, a PMIC within a SiP is provided with communication signals externally available as outputs from the SiP so that they are also available as inputs back into other components of the SiP, and for controlling whether the power generating sections of the PMIC are available for providing power to the components, or only available for controlling and establishing the desired voltages for each of the power generating subsystems of the PMIC. For one example, a number of signaling interconnects for a PMIC in a SiP may be left disconnected on the substrate and require external connections. With these external connections left to be connected, the PMIC voltages may be programmed after the PMIC is put into the SiP without damaging the other components.

These and other features of the present disclosure will become apparent to those skilled in the art from the following detailed description of the disclosure, taken together with the accompanying drawings.

DETAILED DESCRIPTION

Figure 1:
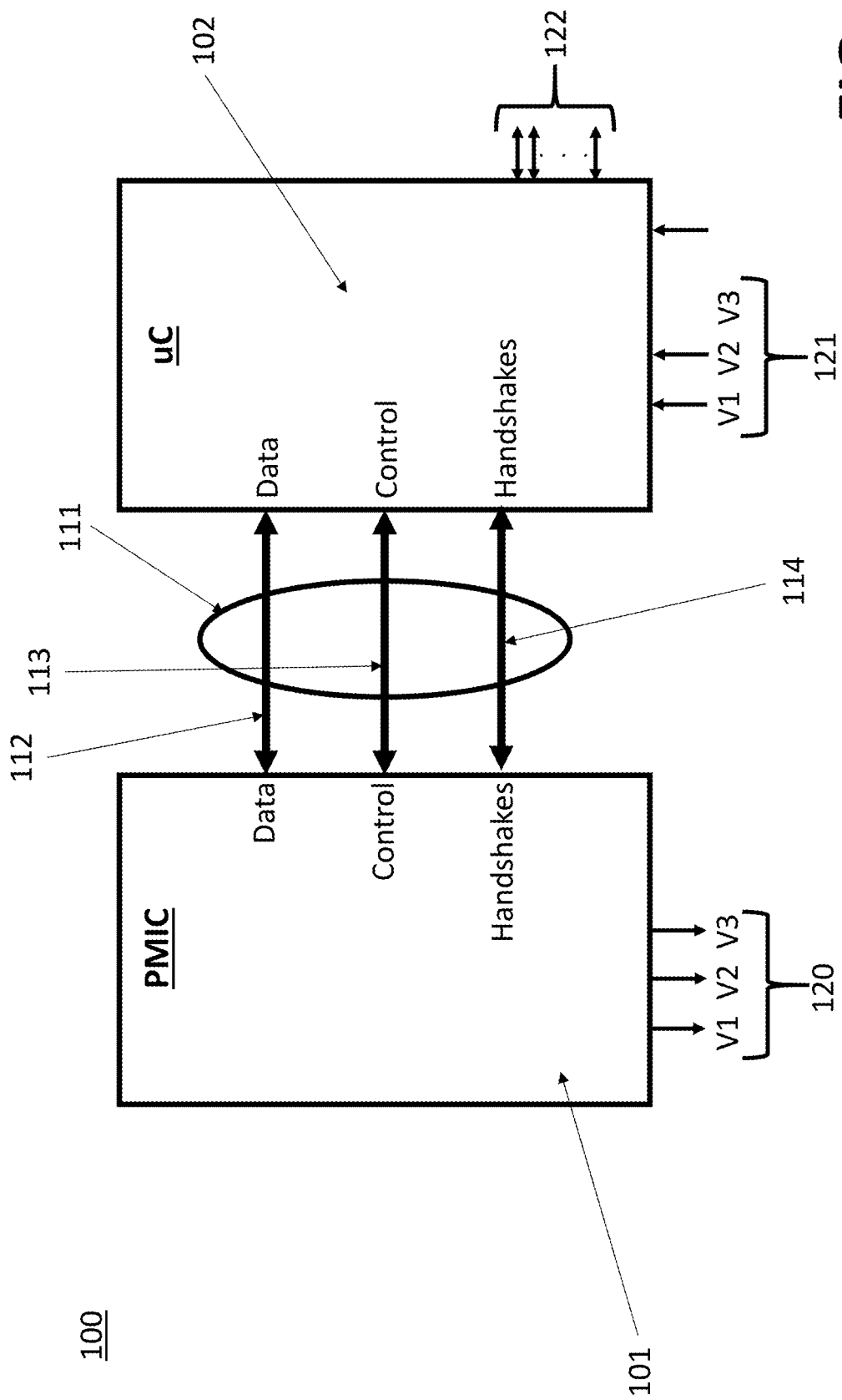
FIG. 1 depicts signaling between a Power Management Integrated Circuit (PMIC) and a microcontroller (uC).

FIG. 1 is a block diagram of a system design 100 having a PMIC 101 and a microcomputer/microcontroller (uC) 102, with communications signals 111. In this figure, the communications signals are illustrated as data, control, and handshake signals, but communications signals between power management devices and other components are not necessarily limited to these examples. Additionally, although a uC is depicted in FIG. 1, the component 102 may optionally, for other system designs and embodiments, be more generally a microprocessor (uP). In the example of FIG. 1, the communications signals 111 are individually labelled 112, 113, and 114. In a traditional system design using a Printed Circuit Board (PCB) and packaged devices, these signals would have been readily accessible on the PCB, such that these communications signals could have been used to troubleshoot the circuits or to manage or modify the power distribution on the PCB by alternative means. But when used in a SiP, for instance, as described in certain embodiments, the signal lines may be routed and connected via communications paths in the substrate used for the SiP, and accordingly encapsulated along with the PMIC, uP, and any other components mounted on the substrate. Thus, when SiP-mounted, the signals 111 would not have been available outside of the SiP.

In the example of FIG. 1, there are illustrated output voltages V1, V2, and V3 (collectively 120) that can be used to power additional components located in the SiP. In a similar manner, the supply of those three voltages (collectively 121) to the uC are depicted, and the interconnection of the uC to the other components of the SiP via various input and output signals 122 are provided.

Figure 2:
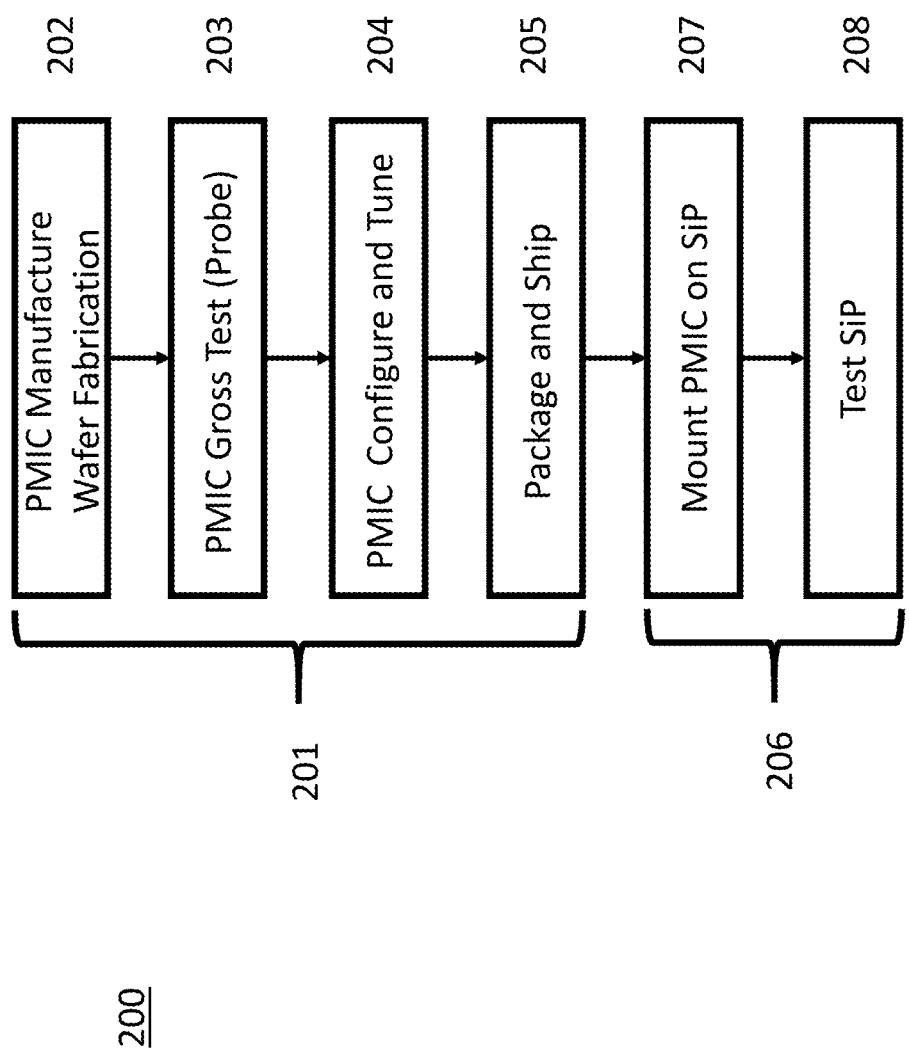
FIG. 2 depicts a process for PMIC manufacture, testing, and mounting in a SiP.

FIG. 2 depicts a manufacturing flow 200 for a PMIC from a PMIC manufacturer 201, which could include semiconductor, wafer-level processing, to an assembler 206 of a system using the PMIC. In this example, the process begins with the manufacture of the PMIC 202, for example, in accordance with normal semiconductor fabrication methods, followed by initial testing or wafer probing 203, followed by configuring and tuning 204 of the PMIC. This may be, for instance, to set the actual desired voltages needed from the PMIC. Flow 200 may then include packaging and shipping 205 of the PMIC to an assembler or customer. Then, the packaged PMIC is mounted on a SiP 207 by a SiP assembler 206. Once the SiP components are all mounted and the SiP is encapsulated in a package, the functionality of the SiP may be tested 208.

Figure 3:
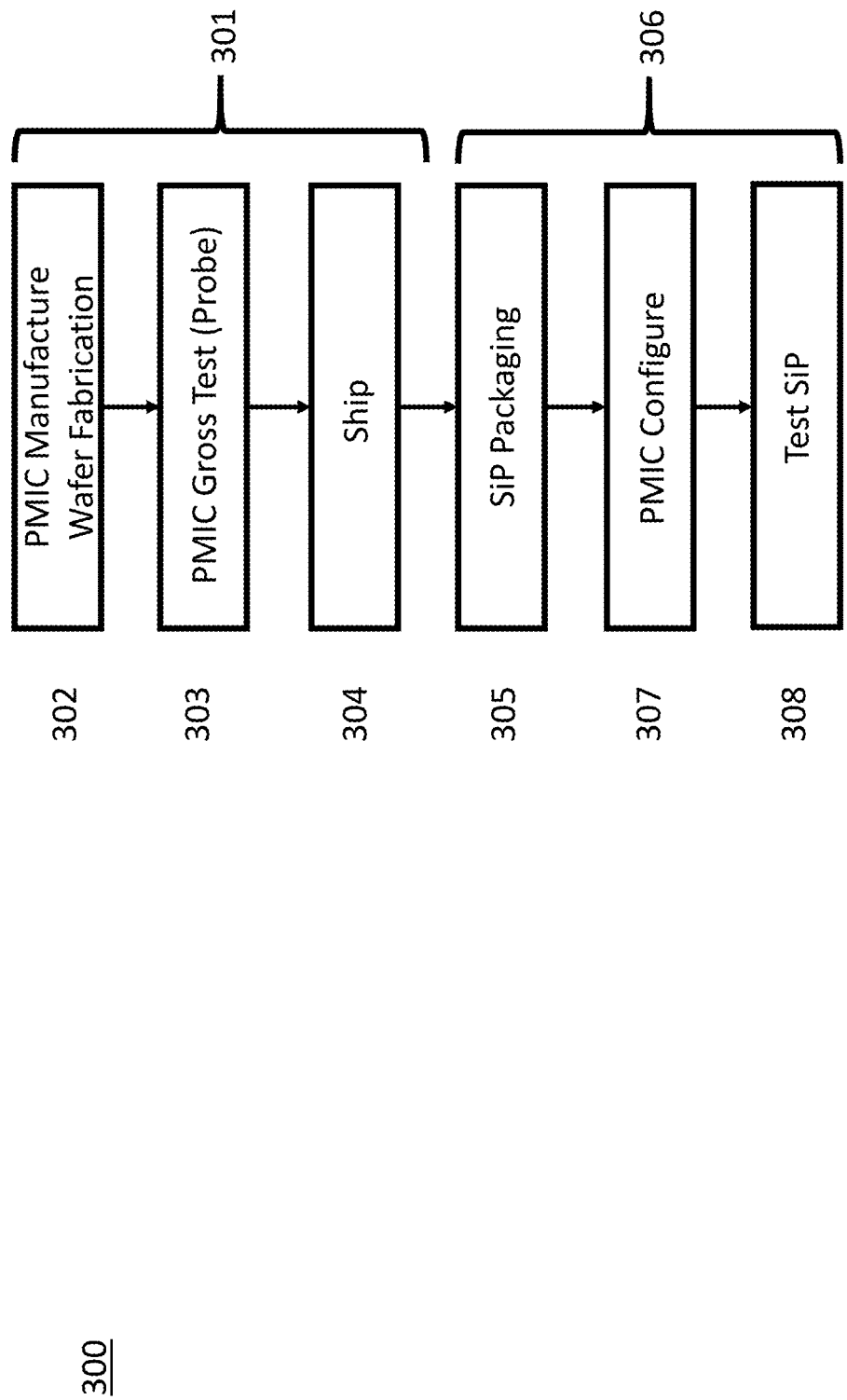
FIG. 3 depicts a process for PMIC manufacture, testing, and mounting in a SiP according to some embodiments.

FIG. 3 depicts a SiP process flow 300 according to some embodiments. Process 300 may have two primary aspects, including manufacture 301 and assembly 306. The process may begin with step 302 with the manufacture of a power management device, such as a PMIC. This may include, for instance, semiconductor, wafer-level processing. This may be followed by step 303, which can include testing, such as wafer probing. In step 304, the device, may be shipped from the manufacturer. For instance, it may be shipped to assembler 306. According to some embodiments, the device, such as a PMIC, is shipped as an unpackaged or "bare" die.

According to some embodiments, in step 305 the power management device is received by the assembler 306 and packaged into a SiP device. Packaging the SiP can include, for instance, mounting the power management device along with any additional components of the SiP onto a SiP substrate, and then encapsulating all the components in a packaging material. This material may include, for instance, various mold compounds (sometimes called plastics), ceramic and/or other materials to protect the components from mechanical, electrical, and/or environmental issues. According to some embodiments, the packaging of the SiP may leave a plurality of external connectors exposed from the packaging, which can be used to access the internal components, such as a PMIC and uP of the SiP. In some embodiments, the additional components include both active and passive components. Also, the substrate may comprise operative interconnections between said power management device and the other internal components.

According to certain further aspects, in step 307, the internal power management device, illustrated as a PMIC, can be configured. This may include, for instance, tuning of one or more settings of the PMIC. In certain aspects, this occurs after the assembly on the SiP substrate by an external device. According to some embodiments, configuring step 307 may be the same or similar as the step 204 of FIG. 2. However depending on the specific process flow, such a configuring step may also be performed by the manufacturer 301 or the by the assembler 306, or by both. In some embodiments, and if both overall configuration and subsequent fine tuning steps remain, then they may be split such that an additional step by the manufacturer following the probe test step 303 does only the configuring, and then the step 307 by the assembler 306 would only do tuning. For instance, a configuring step could set up the appropriate voltages for the PMIC's outputs, and the tuning step would fine tune the exact voltages and any delay or timing for each power (or voltage) becoming available as an output in the SiP. In step 308, the final packaged SiP is then tested 308. After passing final testing it may then be shipped to a customer.

Figure 4:
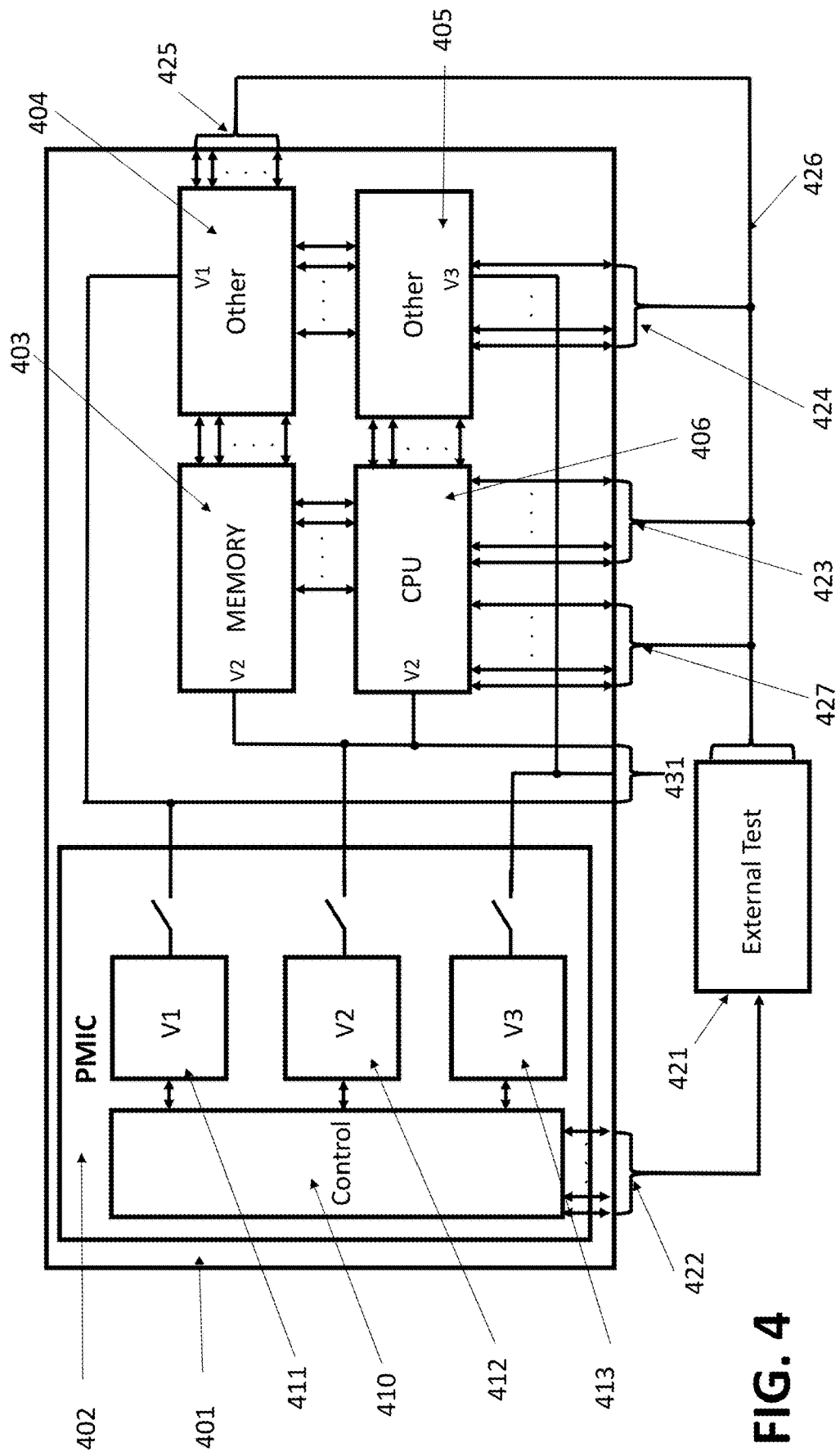
FIG. 4 is a block diagram of a SiP design according to some embodiments.

FIG. 4 depicts a block diagram of an embodiment for a packaged SiP 401. The SiP may be configured for performing preselected functions. This may include, for example, functioning as smart sensors, providing the functions of a complete computer systems, performing aspects of a communication gateways, acting as a smart phones, imaging, etc. The specific preselected functions will be dictated the selection of components and programming of the SiP. In some embodiments, The SiP 401 consists of a substrate, a PMIC 402, a microprocessor 406, memory 403, and other active (and passive) components 404, 405 all suitable for use in a system for performing preselected functions. In certain aspects, the SiP may include a substrate that has operative interconnections on the substrate between the PMIC, microprocessor, memory and other components. As depicted in the example of FIG. 4, all of the components are operating on and supplied with three different voltages V1, V2, and V3 which are generated by the three power generating sections 411, 412, and 413 of the PMIC. Although only three voltages are depicted in FIG. 4 for the PMIC, a PMIC may, depending on its design, provide more than or less than three supply or output voltages. According to some embodiments, each of the power generating sections may be adjusted, again depending on the PMIC design, to provide multiple different voltages under the control of the PMIC control subsystem 410. The PMIC control section 410 may be used to configure and otherwise tune the voltages supplied by each of the three generating section as specified by control signals 422 provided by an external test controller 421. The control subsystem may be, for example, an Electrically Erasable Programmable Read-Only Memory (EE-PROM). The EE-PROM may include, for instance, one more registers corresponding to the different output voltages. Additionally, and in certain aspects, the control sub-system may be externally controllable via one or more inputs of the PMIC 402 or the overall SiP 401.

According to some embodiments, the SiP package encapsulates the substrate, PMIC, microprocessor, and other components, but has a plurality of external connectors exposed from the packaging. A first plurality of these external connectors 423, 424, 425 and 426 may be for normal operation of the SiP, including the performance of its preselected functions. A second plurality of the external connectors may be for selected communications signaling 422 for the PMIC 402 and a microprocessor 406, and a third plurality of the external connectors may be employed for and suitable for either input or output voltages 431 that are normally supplied by the PMIC 402. By doing so, the signals may be connected externally during operation and selectively connected during configuring, including tuning and/or troubleshooting. For instance, they may be connected to an external test controller 421 and/or an external power source for independently powering components of the SiP 401 without the PMIC 402. For instance, if the PMIC has been shut down or otherwise bypassed such that it is no longer powering devices of the SiP 401.

According to some embodiments, delivery of operating power from the PMIC 402 to the other components 403, 404, 405, 406 can be interrupted until the PMIC 402 is properly tuned and/or programmed. This may prevent, for instance, destruction of one or more of components 403, 404, 405, 406 due to the delivery of an improper voltage. These operations may be managed, for instance, by an external logic verification and test controller 421 by switching on and off the three voltage sections 411, 412, 413 using the switches on the outputs of each section responsive to control signals 422 supplied to the PMIC control section 410. Further, the power outputs of the PMIC sections 411, 412, 413, which are V1, V2, and V3, may be interrupted until the PMIC voltage verification and tuning process is completed for each voltage generating section one at a time and then selectively turned back on with control signal 422. The timing by which voltages/components are turned back on may be controlled, for instance, by the configuration of the PMIC 402, including control subsystem 410. Depending on the system design, the appropriate procedure and tests may be developed and implemented to configure the PMIC voltages. Partially powering SiP components with only one of several needed voltages may result in damage to a component, so some care is appropriate in determining how the sections are adjusted and fine-tuned and then used to power up the SiP.

In the example of FIG. 4, signals 423, 424, 425 and 427 are shown and may be inputs and/or outputs from each of three of the components and may be supplied to or received from 426 the external test controller 421. The switches for the three PMIC voltage generating sections 411, 412, 413 may all be open and the necessary voltages supplied to the other SiP components 403, 404, 405, 406 through lines contained in 431 for individual testing of each component, if needed. Alternatively, these same lines 431 may be used to monitor the actual voltages that are being supplied by the PMIC to these components, when the PMIC switches are all closed.

Additionally, each supply or voltage generating section may be tuned after each section 411, 412, or 413 is turned on (switches closed) and then tested by the external tester 421 to see if still set at the correct output voltage when loaded; if not, it may be tuned via control signals 422 and controller 410 to be reset to the desired correct value. In some embodiments, that voltage section may then be shut down (switch opened) and the next section loaded (switch closed) and tested, as needed. In some cases, the system will not function correctly if only one voltage from one generating section is being supplied to the other components, and the other voltages are "off."

Figure 5:
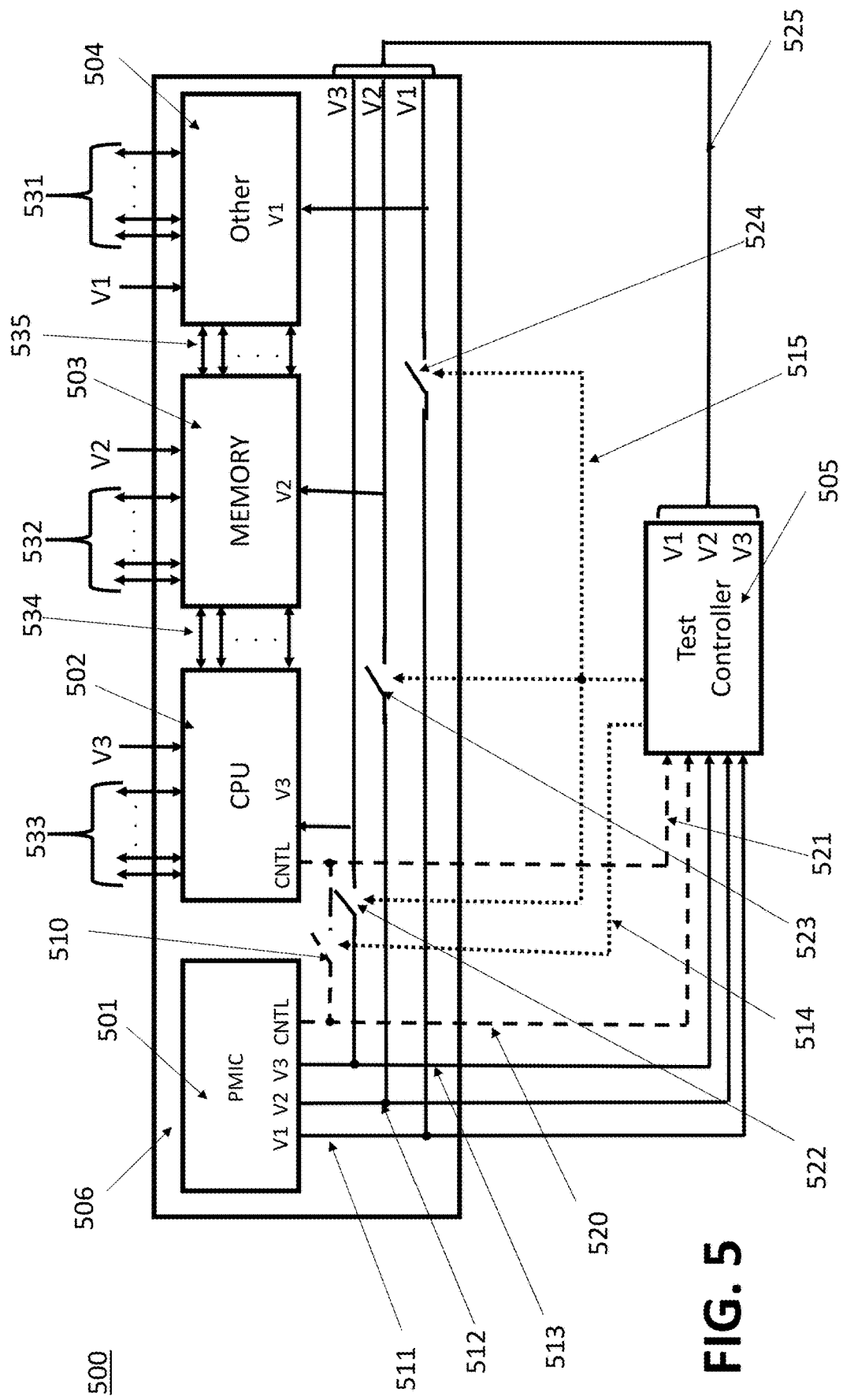
FIG. 5 is a block diagram of a SiP design according to some embodiments.

FIG. 5 depicts an arrangement 500 for configuring a SiP 506 according to some embodiments. For instance, FIG. 5 illustrates the connections for some or all of the communications signals within a SiP, for example, as shown as group 111 in FIG. 1, to external contacts of the SiP 506. In certain aspects, the communications signals may be accessed externally and selectively controlled during configuring, including tuning and/or troubleshooting operations. For instance, through communication signals such as control signaling 520, 521. These operations may be managed, for example, by an external logic verification, programming and test controller 505 by switching on and off the voltages 511, 512, and 513, by controlling switches 522, 523 and 524 using control signals 515. Although only three voltages are depicted in FIG. 5 for the PMIC 501, a PMIC may, depending on its design, provide more than or less than three supply or output voltages.

In the example of FIG. 5, the power outputs 511, 512, 513 of the PMIC 501 may be interrupted until the PMIC set-up and verification process is completed, and then turned back on with an appropriate control signal 515 sent from the test controller 505 to the PMIC 501 and its switches. The switches 522, 523, 524 for each of the three voltages are depicted outside of the PMIC 501 in FIG. 5. Alternatively, these switches may be inside of and be part of the PMIC 501, as in the depiction of the PMIC in FIG. 4. In another alternative, all of these switches may be outside of the SiP and controlled by the test controller 505. For this case, the PMIC voltages are brought out of the PMIC for configuring, tuning and/or troubleshooting operations and then (externally to the SiP and using the SiP external connections, such as pins or a ball grid array) permanently connected to the voltage rails 525 after these operations are completed. FIG. 5 also depicts the normal inputs and outputs 531, 532, 533 for the components 504, 503, 502 of the SiP 506. In addition, FIG. 5 depicts the interconnections 534 and 535 between the components of the SiP that are typically provided by the substrate on which the components are installed. Accordingly, FIG. 5 illustrates one embodiment of a SiP 506 whose design is for performing some preselected function(s), once programming and test controller 505 and its connections are removed.

Figure 6:
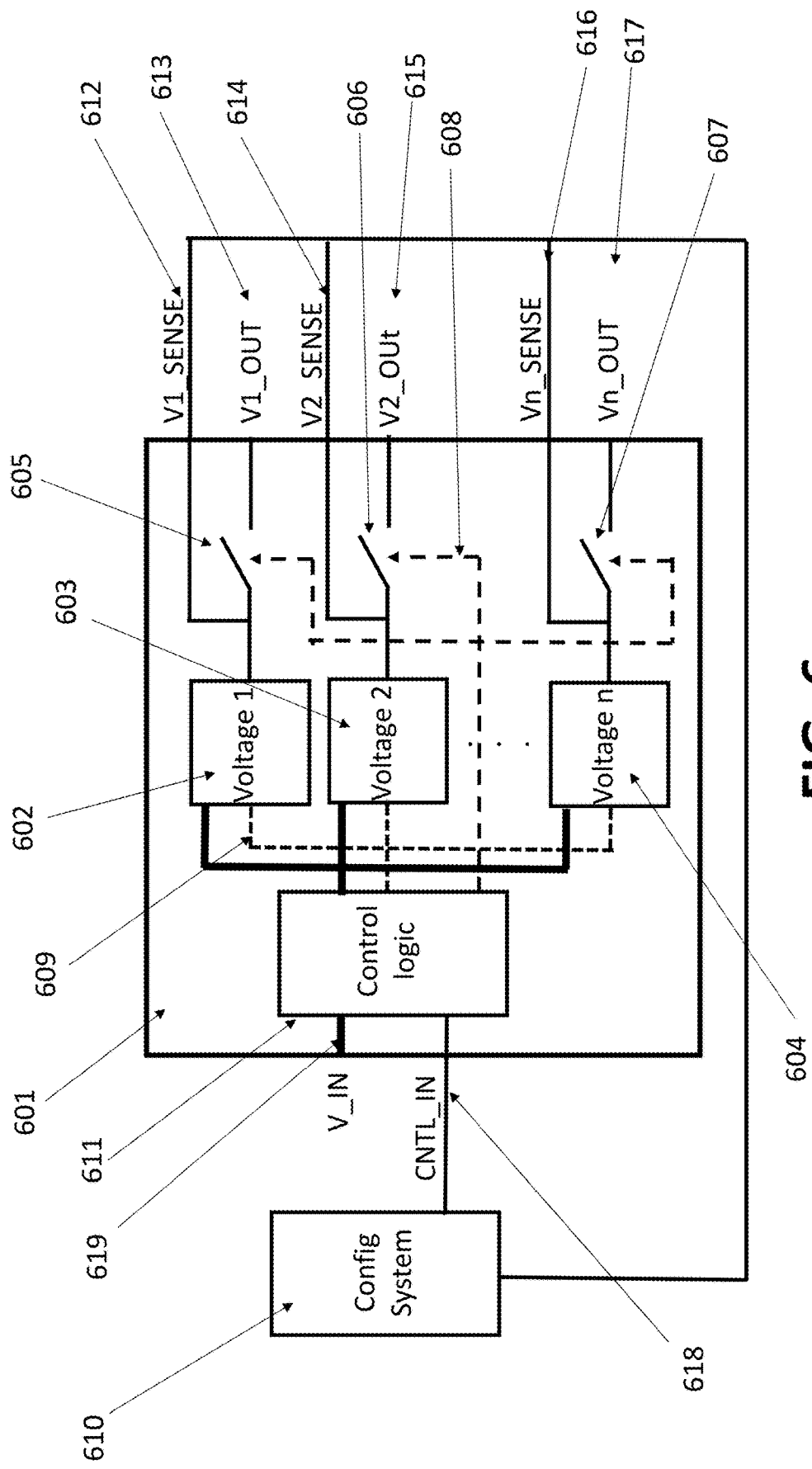
FIG. 6 depicts an arrangement for configuring a PMIC that is integrated in a SiP, according to some embodiments.

FIG. 6 depicts a block diagram of a PMIC 601 according to some embodiments. In certain aspects, this arrangement could allow the PMIC 601 to be configured after it is installed, connected, and fully encapsulated in a SiP device.

In this example, the PMIC 601 has as its inputs V_IN 619 and various control signals 618 which are supplied to the PMIC control logic 611. In turn, each of the power generating sections 602, 603 and 604 of the PMIC are supplied with V_IN and control signals 609 by the control logic 611. In some embodiments, each power generating subsystem would have two outputs, for example, V1_SENSE 612 and V1_OUT 613 (other lines 614, 615, 616, and 617) are also depicted for the other power generating sections). During the configuring process, including tuning, for instance as described with respect to FIGS. 3-5, and prior to powering up the rest of the system, the control logic 611 could be used by an external configuration, programming and test controller 610. In some embodiments, the external controller 610 instructs the internal control logic 611 to open the V1_OUT switch 605 (other output switches 606 and 607 are also depicted), and tunes the outputs of the PMIC 601 using the sense signal lines 612, 614 and 616 as inputs to the external configuration system 610. Once all of the power supplies in the PMIC 601 are configured to the proper desired voltages, the output switches 605, 606 and 607 are turned on to power up the remainder of the SiP. Configuring of the voltage output values may either be done prior to or after the switches are turned on depending on the loading of each section providing a supply voltage V1, V2, V3. In some cases it may be determined to turn on one output voltage at a time. In embodiments, the external controller 610 itself determines how the configuration process, including programming and tuning, would be handled.

In some embodiments, the sense outputs 612, 614 and 616, may not be included. For instance, if a PMIC was provided to the system assembler or manufacturer in packaged form, they would not have to be pinned out in the packaged version of the PMIC and SiP device. This could, in some embodiments, reduce SiP packaging costs by eliminating pins. In this example, however, they would be available in die form for the SiP assembler or manufacturer to connect to the control and sense pins for use to configure and trim the PMIC after it has been assembled into the SiP.

Figure 7A:
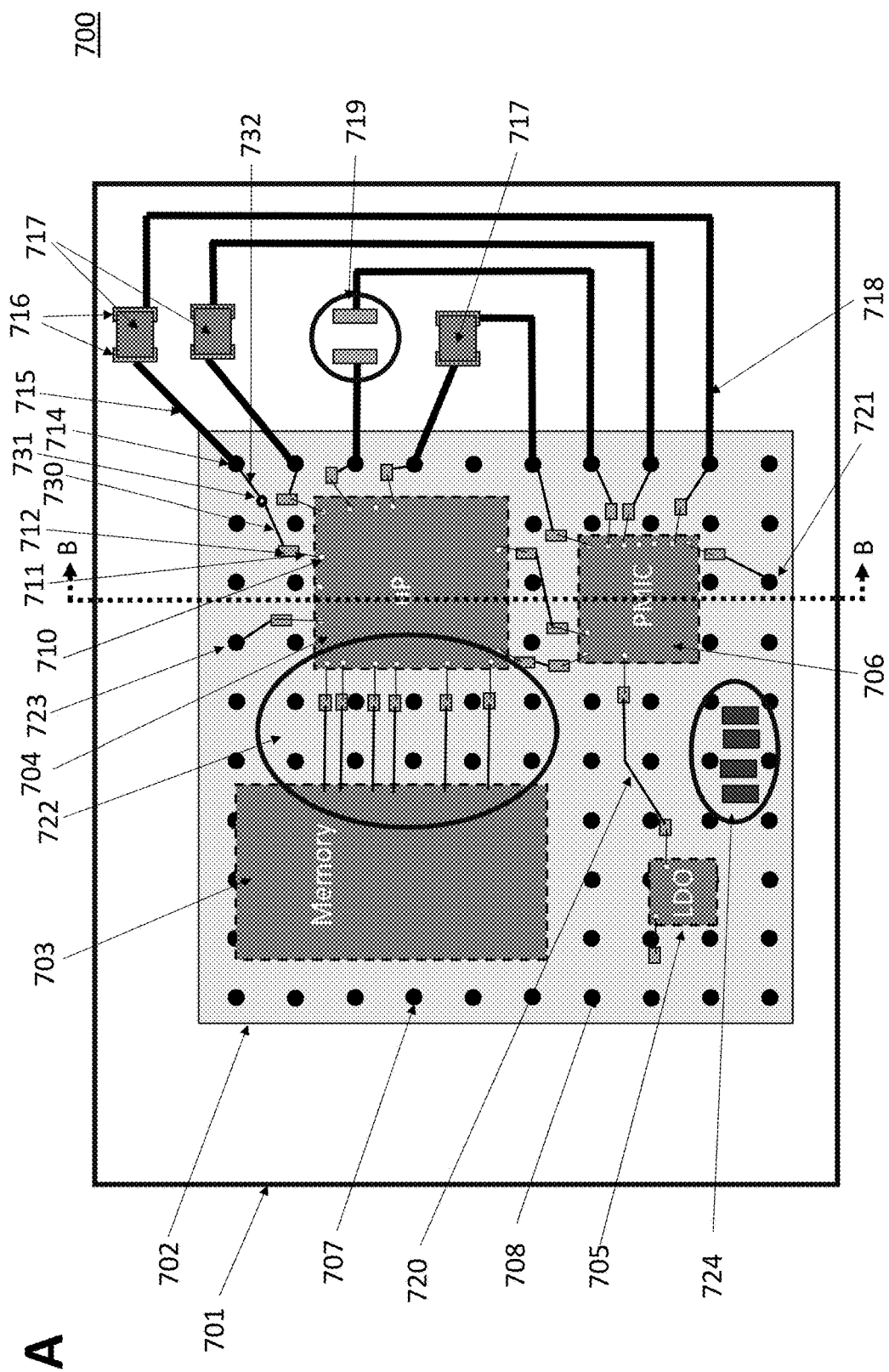
FIGS. 7A-7C depict a system in accordance with some embodiments.

FIG. 7A depicts a system 700 in accordance with some embodiments. In this example, the system includes a Printed Circuit Board (PCB) 701 with a SiP device 702 and resistors 717. Inside the packaged SiP 702 are additional components 703, 704, 705 and 706, which may be active components, along with passive devices (e.g., 724). In some embodiments, the SiP 702 is the only active component attached to the PCB. The ball (or pin) locations for the SiP are depicted as small black dots (like 708) when viewed from the top looking through the SiP package.

In this example, inside the SiP are at least four components, including: a Power Management Integrated Circuit (PMIC) 706, a microprocessor (uP) 704, a Low Drop Out (LDO) power supply 705, and a memory device 703. The PMIC 706 and uP 704 may correspond, in some instances, to the PMIC and uP discussed in regard to FIGS. 3-6. Also included in the SiP of the FIG. 7 example are several passive devises 724 and external connectors. The external connectors may be a connection ball grid array on the back side of the SiP exemplified by 707, 714, 721. According to some embodiments, the connection balls may be replaced by connection pins or similar output wires.

With further reference to FIG. 7A, examples of the various connections between the active devices in the SiP 702 and with the connection balls for external use are: internal connections among components in the SiP 720 and 722; signals connected to the connection balls from various components 723 for use outside of the SiP; power inputs and outputs from the PMIC 706 and LDO 705 to the connection balls 708 and 721; and 4 communications signals between the uP 704 and the PMIC 706, which have been brought out to the PCB through connections 710 through 718, as an example. According to some embodiments, external components, such as external testing/controlling elements discussed in connection with FIGS. 3-6, can contact the internal components of the SiP 702 through one or more contacts, like contact 719. For instance, the external connects (e.g., 707, 714, 721) can provide access to the internal components for programming and/or monitoring. Programming or otherwise configuring can include reprogramming and/or configuring. This may include, for example, updating or completing a set of programming or configuring performed by a manufacturer.

In the example of FIG. 7A, the communications signals, such as signals 722, between the uP 704 and the PMIC 706 are brought to the outside of the SiP, through the external connectors, in order to have them available for troubleshooting a problem, including for external control if desired or for configuring the PMIC 706 after it has been integrated into the SiP 702. For simplicity, only one of the communications signals will be described as follows. The electrical path for the example signal starts at the uP die 704 where a bond wire 711 connects the uP's bond pad 710 to the landing pad on the SiP substrate 712. From the landing pad 712 a signal trace on the substrate top surface 730 connects to a via 731 which connects to a signal trace on the bottom layer 732 which finally connects to a ball 714. From the connection ball 714 a signal trace 715 on the PCB 701 is connected to one of the landing pads 716 by way of a PCB signal trace 715. In this example, a zero ohm resistor 717 or a jumper (not shown) may be electrically attached. The other landing pad 716 is then connected to PMIC 706 through a trace on the PCB to a connection ball to a trace 718 on the substrate of the SiP to the PMIC. In some instances, one or more zero ohm jumpers may be left off (e.g., 719) making it available to be connected to another external device or tester.

Figure 7C:
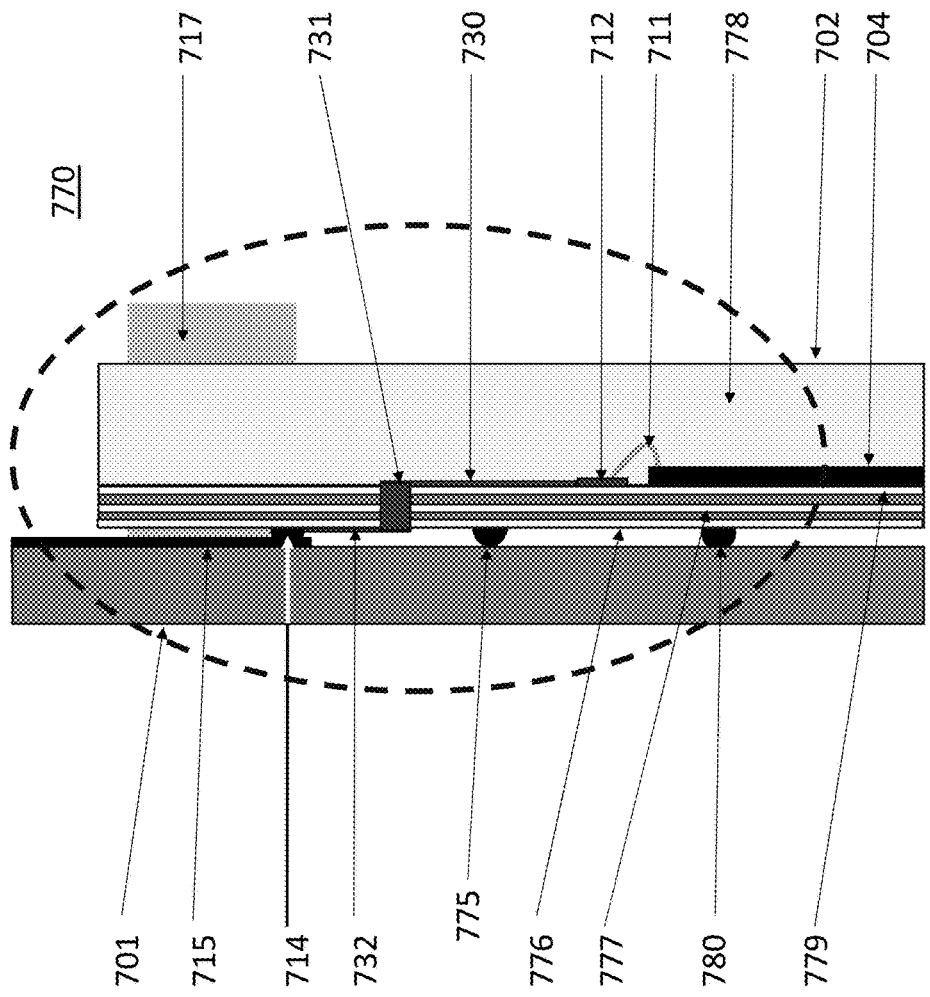
Figure 7B:
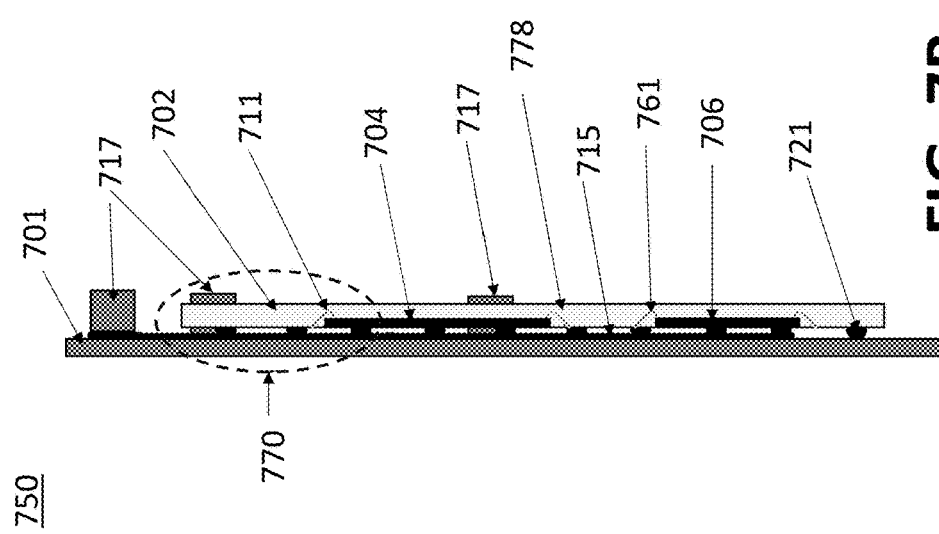

FIG. 7B depicts a cross-section 750 of the system 700 along line "B." This cross-section shows the PCB 701, the SiP 702 and the three zero ohm resistors 717 shown in FIG. 7A. Internal to the SiP are shown the uP 704 and the PMIC 706 electrically connected to the substrate of the SiP using bond wires 761. The SiP 702 is electrically attached to the PCB 701 by the connection balls where they are connected to the appropriate components on the PCB 701 by signal traces. In this example, the zero ohm resistors 717 are connected using the signal traces on the PCB.

FIG. 7C depicts another view of section 770 of FIG. 7B with additional details of the items inside of the SiP 702. From left to right, is the PCB 701, a signal trace 715 on the PCB, three of the SiP's connection balls (e.g., 714, 775, 780), the zero ohm resistor 717 and SiP 702. The SiP consists of a substrate with three layers 776, 777, and 779, traces such as 715 and 730, vias such as 731, landing pads such as 712, wire bonds such as 711, active devices such as 704, all encapsulated within the packaging of the SiP device. The SiP 702 is encapsulated in a package 778 (only a portion of the package is depicted in FIG. 7C).

With respect to FIG. 7C and the example communication signal and electrical path described with respect to FIG. 7A, the uP die 704 is connected to a signal trace 730 on the top surface of the substrate 779 with a bond wire 711 from the uP to a landing pad 712. The top surface trace 730 then connects the landing pad 712 to a via 731. The via connects the trace 712 to a trace 732 on the bottom surface of the substrate 776 which connects to the connection ball 714. Finally the connection ball is attached to the trace 715 on the top surface of the PCB 701.

In FIG. 7, the external connections of the SiP are provided by one more physical connections exposed from the packaging, such as a ball grid array. However, according to some embodiments, external connection to the components may also be provided by a wireless subsystem within the SiP. This may be in addition to, or in place of, the physical connections discussed with regard to the preceding figures. A SiP may include a wireless subsystem having, for example, one or more of an antennae, transmitter, receiver, and transceiver for communicating with devices external to the SiP. For example, the wireless subsystem may communicate internal signaling of the SiP to an external test controller. Similarly, the wireless subsystem may receive programming information for one or more component of the SiP, such as a PMIC. The control of the wireless subsystem may be embedded in such system and/or performed by one or more of a uC (e.g., CPU 406) or code stored in a memory of the SiP (e.g., memory 403). According to some embodiments, use of the wireless subsystem would allow for the SiP to be completely encapsulated during packaging, without any exposed physical connections. This may be beneficial in certain applications, for instance, with respect to smart sensors (smart dust), remote sensors which need to be self-powered while wirelessly communicating with the rest of the system of which they are part. Some specific examples may include devices that cannot be readily accessed but must be monitored and/or configured, such as those on the airframe of an airplane or electronics implanted into a human or animal body.

Figure 8:
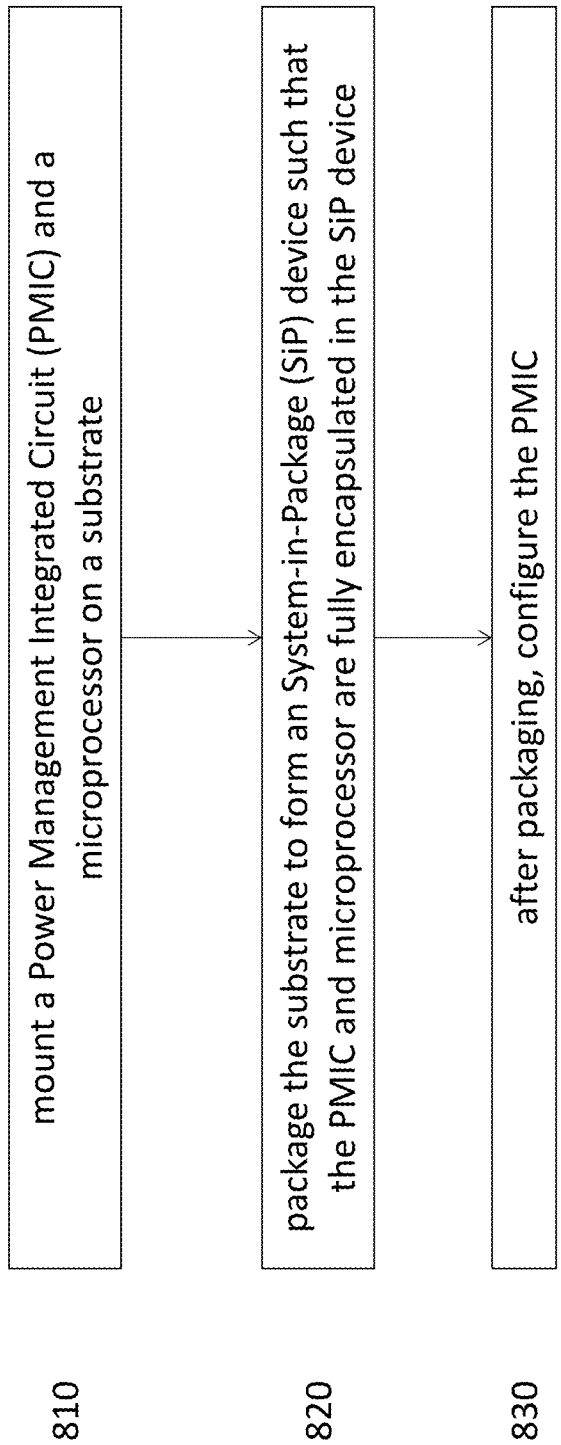
FIG. 8 depicts a process for configuring a packaged power management device according to some embodiments.

Referring now to FIG. 8, a process 800 for configuring a power management device, such as a PMIC in accordance with some embodiments, is provided. The process may include, for instance, use of one or more of the devices and systems described with respect to FIGS. 3-7. The process may begin with step 810, in which the PMIC is mounted, along with a microprocessor, to a substrate. In step 820, the substrate is packaged to form a SiP device, such that the both the PMIC and the microprocessor are fully encapsulated in the SiP device. According to some embodiments, one or more external connectors of the SiP remain exposed from the packaging following step 820. In step 830, after packaging step 820, the PMIC is configured.

According to some embodiments, the configuring of step 830 can include communicating with the PMIC through the external contacts in electrical contact with the PMIC to program the PMIC. Alternatively, the PMIC could be connected to and programmed via a wireless subsystem of the SiP. The programming may be performed, for instance, by a test controller, such as device 421, 505, or 610. In some aspects, the programming may include modifying a register value of the PMIC. The register value may correspond to and/or define an operational output voltage of the PMIC for a particular component of the SiP. In some embodiments, configuring 830 includes opening one or more switches of the SiP to interrupt delivery of an output voltage from the PMIC to at least one component the SiP. That is, in some embodiments, configuration of the device can be performed while one or more power outputs of the PMIC is interrupted. This may further include, for example, measuring a sense value of the PMIC, verifying the measured sense value, and then closing a switch of the SiP to re-establish a power output based on said verifying. This could protect elements of the SiP against the delivery of an improper, destructive power level. Similarly, elements may be protected by establishing at least one timing parameter for sequential-power up, which is controlled by the PMIC. As with other aspects, these timing parameters may be programmed via external communication.

In some embodiments, configuring of the PMIC at step 830 can include: mounting the SiP device on a test structure; actuating one or more switches of the test structure; measuring a sense value of the PMIC; and modifying at least one setting of the PMIC based on the sense value. The test structure may be, for example, a PCB-implemented tester.

Figure 9:
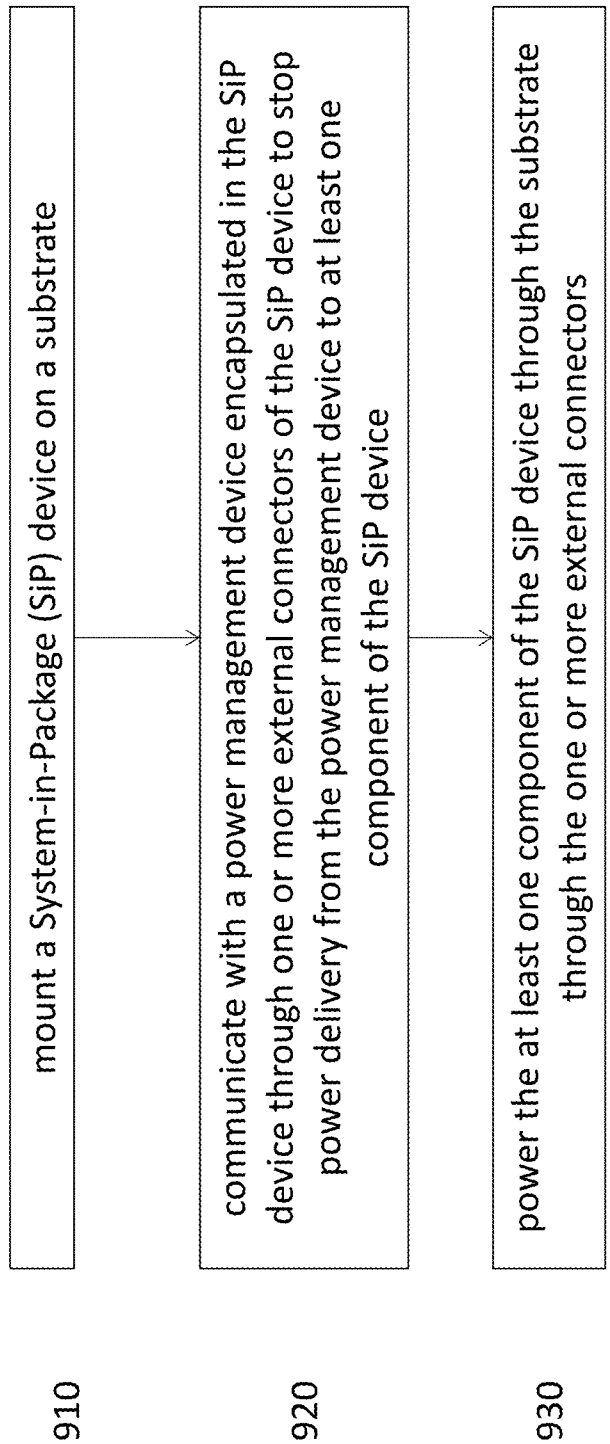
FIG. 9 depicts a process for powering a SiP device according to some embodiments.

Referring now to FIG. 9 a process 900 for powering a SiP device is provided. The process may include, for instance, use of one or more of the devices and systems described with respect to FIGS. 3-7. The process may also include one or more steps of process 800, set forth with respect to FIG. 8. According to some embodiments, process 900 may begin with step 910, in which a packaged SiP device is mounted onto a substrate, such as a PCB. In step 920, a power management device encapsulated in the SiP device, such as a PMIC, is communicated with via one or more external connectors of the SiP device. This may include, for instance, control signaling to stop power delivery from the power management device to one or more other components of the SiP. Then, in step 930, these components can be powered through the substrate and external connectors. Thus, in some embodiments, power delivery of the PMIC can be supplemented or replaced with power delivery through the substrate.

Some figures illustrate processes in accordance with certain embodiments. These processes may be performed using one or more of the foregoing devices, systems, and or flows. According to some embodiments, the disclosed devices, systems, and processes may be implemented using a non-transitory computer readable medium storing computer code for processing a set analog and digital input signals, the computer code being executable by a processor, such as a mixed signal processor, to cause the processor to perform one or more of the foregoing. In some aspects, a memory and processor are provided, where the memory includes instructions executable by the processor to perform one or more of the foregoing.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A System-in-Package (SiP) device, comprising:
   a substrate;
   a power management device;
   a microprocessor;
   one or more additional components, wherein said additional components and said microprocessor are arranged such that the SiP device performs one or more preselected functions;

a package encapsulating said substrate, said power management device, said microprocessor, and said additional components; and a plurality of external connectors, wherein a first plurality of said external connectors are for one or more of providing and receiving signals corresponding to said one or more preselected functions during operation of the SiP device, wherein a second plurality of said external connectors are for one or more of providing and receiving communications signaling for one or more of said power management device and said microprocessor, wherein said power management device is a Power Management Integrated Circuit (PMIC), wherein said plurality of external connectors is arranged such that said PMIC can be configured by an external device, and wherein said PMIC comprises:
- at least one programmable power generating subsystem configured to output a plurality of signals, wherein a first of said plurality of signals has a first value for powering one or more components of a device, and a second of said plurality of signals has a second value, wherein said first value is an operational value and said second value is a monitoring value indicative of said first value; and
- a control logic subsystem for setting said first value.

2. The SiP device of claim 1, wherein said microprocessor is a microcontroller or microcomputer.

3. The SiP device of claim 1, wherein the plurality of external connectors are pin connectors or a ball grid array.

4. The SiP device of claim 1, wherein said substrate comprises operative interconnections between said power management device, said microprocessor, and at least one of said additional components.

5. The SiP device of claim 1, wherein said additional components comprise both active and passive components.

6. The SiP device of claim 1, wherein said additional components comprise one or more of a Low Drop Out (LDO) power supply, memory, and wireless communication subsystem.

7. The SiP device of claim 1, wherein a third plurality of said external connectors are for one or more of providing and receiving at least one of an input voltage and an output voltage of said power management device.

8. The SiP device of claim 1, wherein said PMIC comprises one or more sense line outputs for monitoring an operational voltage of said SiP device, wherein said sense lines are directly connected to one or more of said plurality of external connectors.

9. The SiP device of claim 1, further comprising:
one or more externally controllable switches.

10. The SiP device of claim 9, wherein at least one of said one or more externally controllable switches is arranged to interrupt an output voltage of said power management device, switch an output of the SiP device to control signaling, or enable a read-out of voltage levels within the SiP device.

11. The SiP device of claim 1, wherein said communications signaling comprises one or more of control signaling, hand-shake signaling, and data signaling.

12. The SiP device of claim 1, wherein said first and second values are the same.

13. The SiP device of claim 1, wherein said control logic subsystem is configured to modify said first value based on said second value.

14. The SiP device of claim 1, wherein said control logic subsystem comprises an Electrically Erasable Programmable Read-Only Memory (EE-PROM).

15. The SiP device of claim 14, wherein said power generating subsystem is configured to read one or more registers of said EE-PROM to modify said first value.

16. The SiP device of claim 1, wherein said control logic subsystem is externally controllable via one or more inputs of the PMIC.

17. The SiP device of claim 1, further comprising:
a plurality of externally controllable switches.

18. The SiP device of claim 17, wherein said plurality of switches is arranged to selectively prevent output of the first of said plurality of signals and enable output of the second of said plurality of signals.

19. The SiP device of claim 18, wherein said PMIC further comprises:
selected communication signals to control outputs from said at least one programmable power generating subsystem to control whether said power generating subsystems of said PMIC provide power to components of said SiP or establish desired output voltages for each of said power generating subsystems.

20. The SiP device of claim 19 wherein said selected communication signals also allow for an external power source to provide power to components of said SiP.

21. The SiP device of claim 1, wherein said plurality of external connectors are at least partially exposed from said package.

22. The SiP device of claim 1, wherein said plurality of external connectors comprise a wireless communications subsystem.

23. The SiP device of claim 1, wherein said communications signaling is for one or more of testing, programming, and modifying a setting of said power management device or said microprocessor.

* * * * *